(12) United States Patent
Lu

(10) Patent No.: US 11,982,500 B2
(45) Date of Patent: May 14, 2024

(54) HEAT SINK

(71) Applicant: DELTA ELECTRONICS, INC., Taoyuan (TW)

(72) Inventor: Chao-Wen Lu, Taoyuan Hsien (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 17/656,194

(22) Filed: Mar. 23, 2022

(65) Prior Publication Data

US 2022/0214120 A1    Jul. 7, 2022

Related U.S. Application Data

(63) Continuation of application No. 16/557,470, filed on Aug. 30, 2019, now abandoned, which is a (Continued)

(30) Foreign Application Priority Data

Sep. 6, 2013 (TW) ................................ 102132171

(51) Int. Cl.
*F28F 13/06* (2006.01)
*H01L 23/40* (2006.01)

(52) U.S. Cl.
CPC .......... *F28F 13/06* (2013.01); *H01L 23/4006* (2013.01); *F28F 2215/00* (2013.01);
(Continued)

(58) Field of Classification Search
CPC ... F28F 13/06; F28F 2215/00; H01L 23/4006; H01L 2023/4043; H01L 2023/4062; H01L 2023/4087
See application file for complete search history.

(56) References Cited

U.S. PATENT DOCUMENTS 3,143,592 A * 8/1964 August ............... F28D 15/0275
257/722
4,621,884 A * 11/1986 Berkebile, Jr. ...... H05K 7/1069
439/367
(Continued)

FOREIGN PATENT DOCUMENTS

CN       2881952 Y     3/2007
CN    101872225 A    10/2010
(Continued)

*Primary Examiner* — Gordon A Jones
(74) *Attorney, Agent, or Firm* — Muncy, Geissler, Olds & Lowe, P.C.

(57) ABSTRACT

A heat sink includes a heat conduction portion and a heat dissipation portion. The heat conduction portion is a flat plate with two main surfaces parallel with each other and a plurality of side surfaces. One of the two main surfaces is a contacting surface contacting a heat source. The heat dissipation portion is extended outward from at least one of the plurality of side surfaces of the heat conduction portion. The heat dissipation portion includes a plurality of first branches and a plurality of second branches. Each of the first branches is a flat plate and has two opposite main surfaces and four side surfaces. The two opposite main surfaces of each of the first branches are parallel to the two main surfaces of the heat conduction portion. The second branches are extended from the first branches and parallel to the heat conduction portion.

17 Claims, 6 Drawing Sheets

Related U.S. Application Data continuation-in-part of application No. 14/279,872, filed on May 16, 2014, now abandoned.

(52) U.S. Cl.
CPC ............. *H01L 2023/4043* (2013.01); *H01L 2023/4062* (2013.01); *H01L 2023/4087* (2013.01)

(56) References Cited

U.S. PATENT DOCUMENTS

| | | | | |
|---|---|---|---|---|
| 6,111,752 | A * | 8/2000 | Huang | H01L 23/4093 174/16.3 |
| 6,201,699 | B1 | 3/2001 | Ayres et al. | |
| 6,241,007 | B1 | 6/2001 | Kitahara et al. | |
| 6,343,014 | B1 | 1/2002 | Lin | |
| 6,442,025 | B2 | 8/2002 | Nakamura et al. | |
| 6,622,786 | B1 | 9/2003 | Calmidi et al. | |
| 6,865,082 | B2 * | 3/2005 | Huang | H01L 23/367 361/720 |
| 7,151,669 | B2 * | 12/2006 | Liu | H01L 23/4093 165/185 |
| D567,772 | S | 4/2008 | Lin et al. | |
| 7,426,112 | B2 * | 9/2008 | Chi-Wei | H01L 23/427 165/80.4 |
| 7,701,719 | B2 * | 4/2010 | Chen | F28D 15/0275 24/453 |
| 7,907,411 | B2 | 3/2011 | Whittum et al. | |
| 8,297,341 | B2 * | 10/2012 | Liang | H05K 7/20409 165/185 |
| 8,550,148 | B2 * | 10/2013 | Huang | H01L 23/4006 165/104.26 |
| 8,567,483 | B2 * | 10/2013 | Kamath | H01L 23/4006 165/104.21 |
| 9,175,911 | B2 * | 11/2015 | Huang | F28D 15/0275 |
| 9,441,891 | B2 | 9/2016 | Tsou et al. | |
| 2007/0242437 | A1 * | 10/2007 | Tien | H01L 23/4093 257/E23.088 |
| 2007/0253769 | A1 * | 11/2007 | Hwang | H01L 23/4093 403/326 |
| 2007/0272395 | A1 * | 11/2007 | Hwang | H01L 23/427 165/104.33 |
| 2007/0274049 | A1 * | 11/2007 | Lin | H01L 23/4006 257/E23.084 |
| 2009/0120612 | A1 * | 5/2009 | Zhang | F21V 29/75 165/80.3 |
| 2009/0129103 | A1 * | 5/2009 | Zhang | F21V 29/75 362/373 |
| 2009/0251857 | A1 | 10/2009 | Legen et al. | |
| 2009/0279247 | A1 | 11/2009 | Chen et al. | |
| 2010/0008094 | A1 * | 1/2010 | Shuai | F21V 29/76 362/373 |
| 2010/0238630 | A1 | 9/2010 | Xu et al. | |
| 2013/0269920 | A1 | 10/2013 | Taketomi et al. | |
| 2015/0187675 | A1 | 7/2015 | Tang et al. | |

FOREIGN PATENT DOCUMENTS

| | | |
|---|---|---|
| KR | 100960131 B1 | 5/2010 |
| TW | M363612 U | 8/2009 |
| TW | 201333410 A | 8/2013 |

* cited by examiner

HEAT SINK

CROSS REFERENCE TO RELATED APPLICATIONS

This application is a Continuation application of U.S. Ser. No. 16/557,470, filed on Aug. 30, 2019, which is a Continuation-in-part (CIP) of U.S. Ser. No. 14/279,872, filed on May 16, 2014, now abandoned, for which claims priority under U.S.C. § 119(a) on Patent Application No(s). 102132171 filed in Taiwan, Republic of China on Sep. 6, 2013. This and all other extrinsic materials discussed herein are incorporated by reference in their entirety.

BACKGROUND OF THE INVENTION

Field of Invention

The invention relates to a heat sink and, in particular, to a heat sink that can be applied to a narrow space.

Related Art

With the progress of technologies, the device integration of an electronic product is getting higher and the size thereof is getting smaller. Accordingly, the heat per unit area generated by the electronic product during the operation is raised increasingly. If the heat can not be dissipated properly, the electronic product can be reduced in efficiency and even burned down by heat. Therefore, a heat dissipation apparatus (heat sink) has become indispensible for the electronic product currently.

There are many types for the commonly-used heat dissipation apparatus, such as a heat pipe, vapor chamber or metal sheet without heat pipe. A heat pipe is disposed between a heat source (e.g. a chip) and a heat dissipation fin, operating with a medium therein that can transfer heat by the phase change mechanism. However, when the electronic apparatus using the heat pipe is changed in orientation, the medium in the heat pipe may reflow unexpectedly and the heat conduction effect is thus unstable. Besides, because the heat pipe is an incomplete heat dissipation apparatus, it needs to cooperate with another heat dissipation module (e.g. a metal device or heat dissipation fin), so the related manufacturing will be more complicated and the cost will be raised. In addition, if the heat pipe has a bending portion of a large angle, the flow of the medium therein will be influenced thereby and the heat conduction effect is thus decreased. Besides, if the heat pipe is applied to a narrow space, it needs to be flattened for the proper use but also with weaker structure strength. Accordingly, when the space over the heat source is not enough to contain the heat pipe with the related strengthening structure and fixture, the heat dissipation method by using the heat pipe is not suitable anymore. Therefore, with the trend towards the compactness of the electronic apparatus, the development of the heat pipe applied to the electronic currently encounters a bottleneck.

The vapor chamber operates in the same principle as the heat pipe, but just with a different direction of the heat conduction. The direction of the heat conduction of the heat pipe belongs to one-dimensional conduction, and that of the vapor chamber belongs to two-dimensional conduction so it can dissipate the heat evenly with a lower spreading resistance. However, because the vapor chamber can be considered a kind of two-dimensional development of the heat pipe, the shortcomings of the heat pipe are also included in the vapor chamber and the manufacturing cost may be higher than the heat pipe.

For the electronic apparatus that doesn't use the heat pipe for the heat conduction and dissipation, the metal material of high heat conductivity, such as copper or aluminum, is used on the surface of the heat source and extended to the adjacent fan to become a part, such as an upper cover, of the fan for the heat dissipation. However, before transferred to the fan, the heat needs to travel through the heat conduction material, usually in a thin-plate form with a bad heat conduction effect, that has a certain length and is disposed between the heat source (e.g. a chip) and the fan, the heat conduction effect will get some loss during the traveling path. Accordingly, this kind of heat conduction method provides a limited and unsatisfying efficiency. Therefore, it is an important subject to provide a better heat dissipation mechanism that can be applied to a narrow space.

SUMMARY OF THE INVENTION

In view of the foregoing subject, an objective of the invention is to provide a heat dissipation apparatus, i.e. heat sink, that can be applied to a narrow space.

A heat sink according to the invention includes a heat conduction portion and a heat dissipation portion. The heat conduction portion contacts a heat source with a flat form. The heat dissipation portion is extended outward from at least one side of the thickness of the heat conduction portion and parallel to the heat conduction portion. The heat dissipation portion includes at least a first branch extended from the heat conduction portion and at least a second branch extended from the first branch.

In one embodiment, the heat dissipation portion is extended substantially parallel to a surface of the heat source contacting the heat conduction portion.

In one embodiment, the heat sink further includes at least a bending portion formed between the heat conduction portion and the first branch.

In one embodiment, the second branches extended from the two adjacent first branches are connected together.

In one embodiment, at least a through hole is formed between the two adjacent first branches.

In one embodiment, the heat dissipation portion is formed a wavy shape from a horizontal direction parallel to the heat conduction portion.

In one embodiment, the heat dissipation portion is formed a ladder-like shape from a horizontal direction parallel to the heat conduction portion.

In one embodiment, at least two of the first branches are not coplanar.

In one embodiment, at least two of the second branches are disposed on different levels.

In one embodiment, the first and second branches are coplanar.

In one embodiment, the first and second branches have different thickness.

In one embodiment, the second braches extended from the two adjacent first branches are connected together.

In one embodiment, the heat conduction portion and the heat dissipation portion are integrated into a single structure.

In one embodiment, the height of the heat sink is between 0.5 mm and 6.5 mm.

In one embodiment, at least a flow guiding structure is disposed in the space formed by a side of the heat source and a flat portion of the heat conduction portion contacting the heat source.

As mentioned above, according to the heat sink of the invention applied to a narrow space, a heat conduction material of a certain thickness disposed on the top of the heat source is expanded horizontally to generate a branch structure and vertically changed in shape. Therefore, the heat sink is designed on the basis of the concept of horizontal and vertical structures so as to create three-dimensional airflow channels, so that the windward area and the heat exchange area between the heat sink and the air can be both increased, and the heat can be dissipated by both of the conduction and convection effects. Besides, the heat sink directly contacts the heat source, so that the heat conduction path can be reduced. Furthermore, the heat sink has a solid structure to contribute a more reliable strength and to be made by a simpler process.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
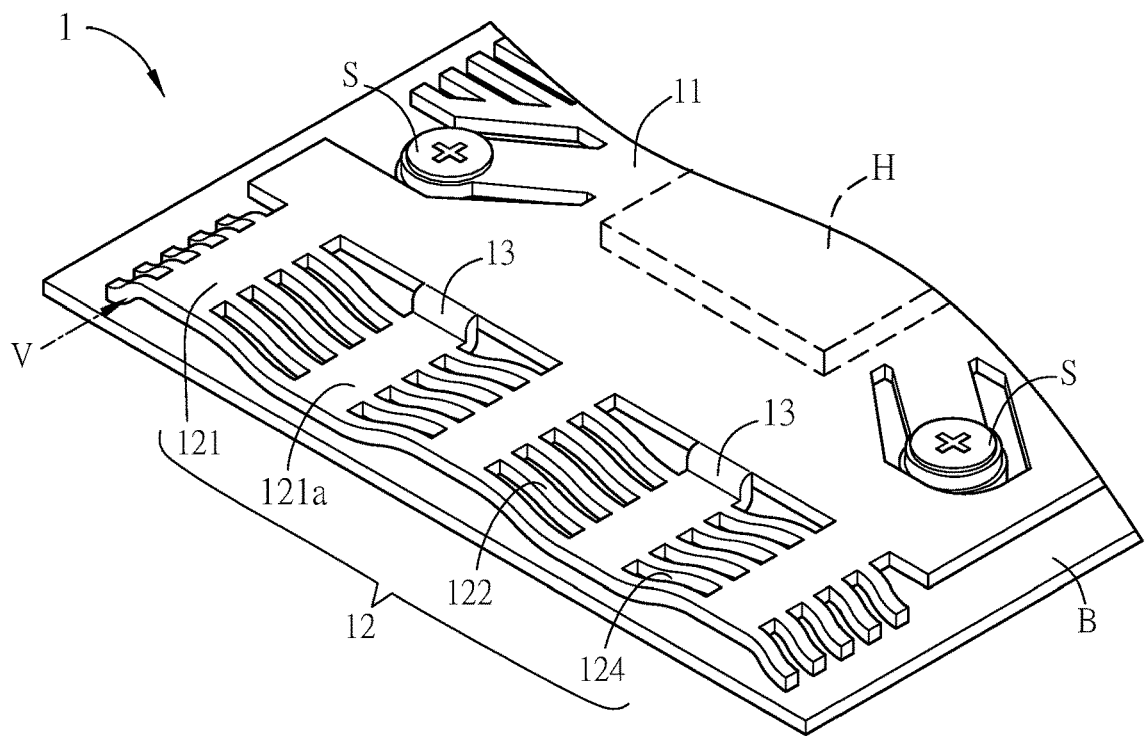
FIGS. 1A and 1B are schematic diagrams of a heat sink according to a first embodiment of the invention.
Figure 2A:
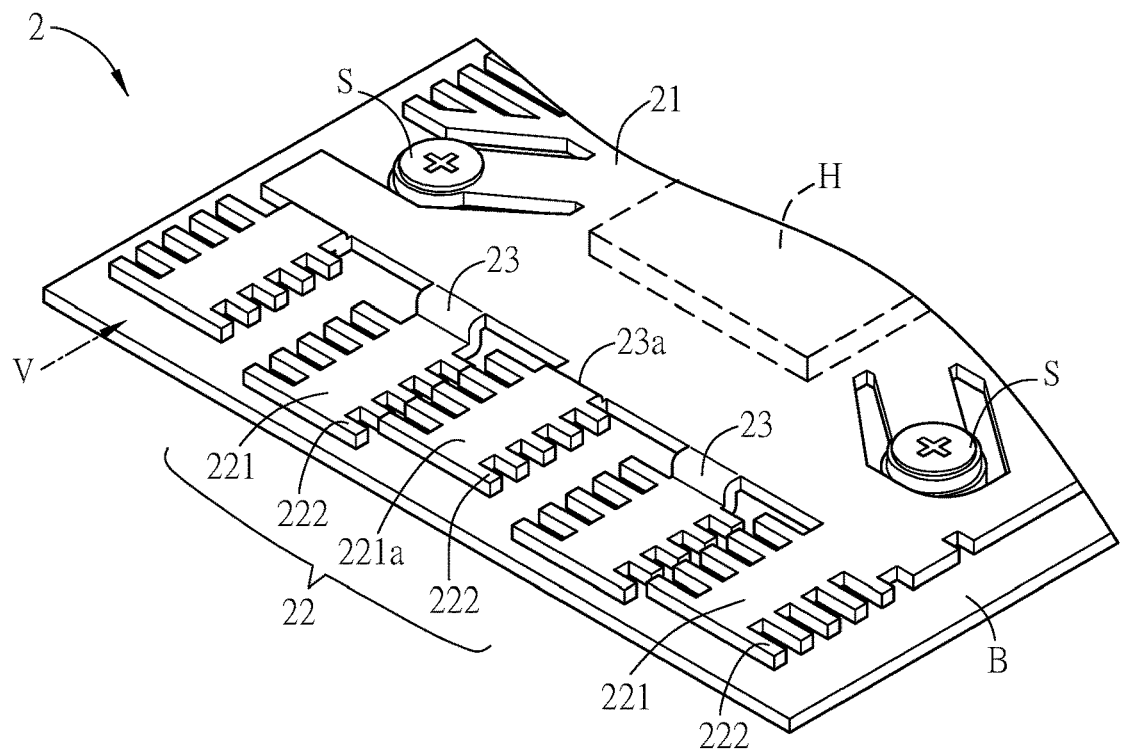
FIGS. 2A and 2B are schematic diagrams of a heat sink according to a second embodiment of the invention.
Figure 3:
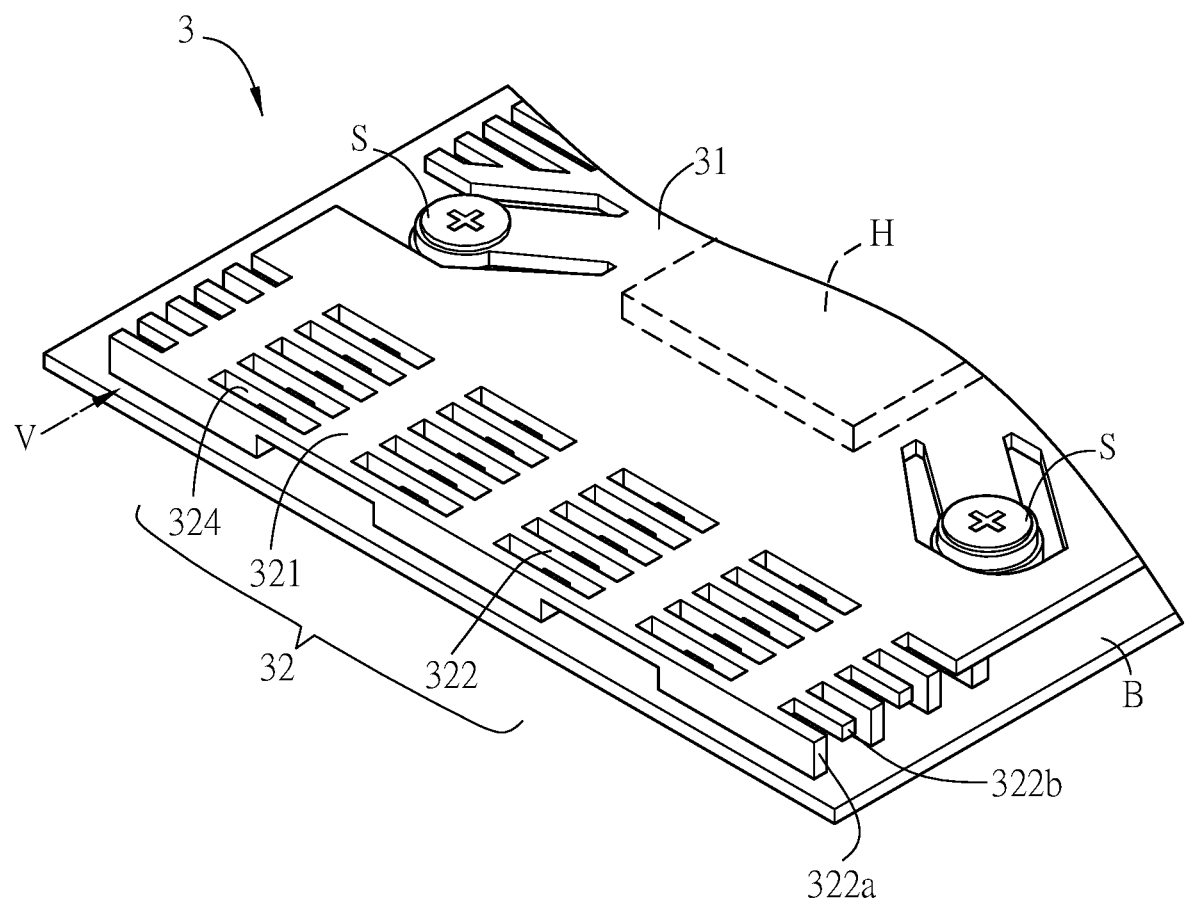
FIG. 3 is a schematic diagram of a heat sink according to a third embodiment of the invention.
Figure 4A:
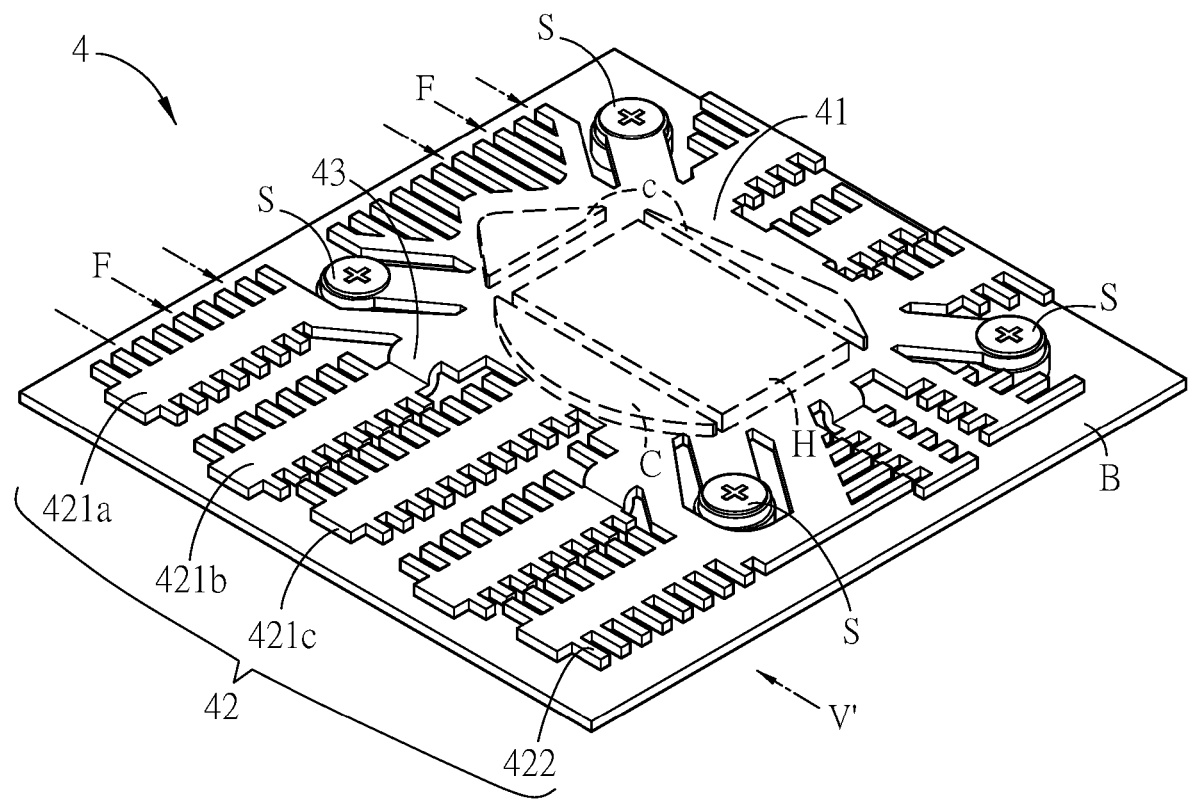
FIG. 4A is a schematic diagram of a heat sink according to a fourth embodiment of the invention.

A heat dissipation apparatus, such as a heat sink, according to a preferred embodiment of the invention approximates to a rectangular form and provides the effect of heat conduction and dissipation. As shown in FIG. 4A, the heat conduction portion of the heat sink has a thickness and at least four sides, and one of the sides is used as a main extending direction for a heat dissipation portion. The extending direction can be formed by the two adjacent sides extending outward, the two opposite sides extending outward, or the three or four sides extending outward. However, the invention is not limited thereto. In this embodiment, one of the main extending direction of the heat dissipation portion is formed as shown in FIG. 1A, 2A or 3. Besides, the heat sink in this embodiment has a flat form for a narrow space.

Figure 1B:
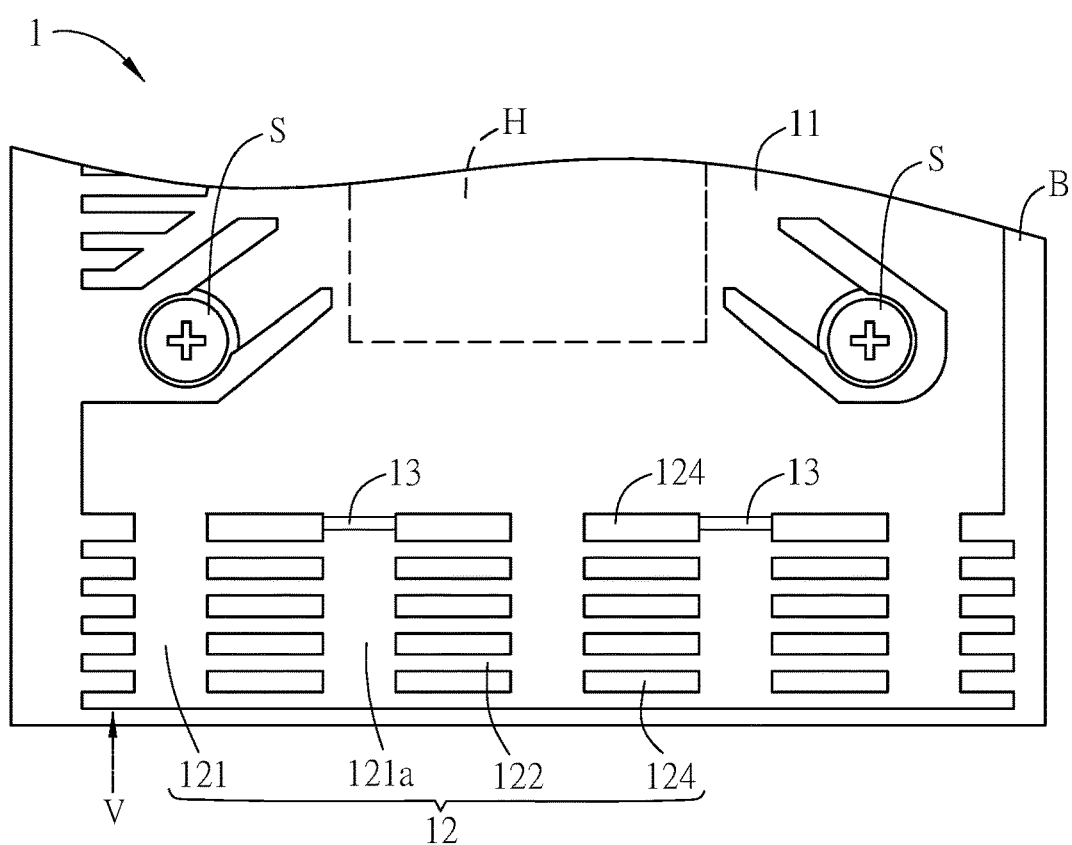

FIG. 1A is a schematic diagram of a heat sink according to a first embodiment of the invention, and FIG. 1B is a top-view diagram of the heat sink in FIG. 1A. As shown in FIGS. 1A and 1B, the heat sink 1 includes a heat conduction portion 11 and a heat dissipation portion 12. The heat conduction portion 11 is made by at least one heat conduction material with a flat form and a thickness, and a flat portion thereof contacts a heat source H. In one embodiment, the heat source H can be a chip disposed on a circuit board, or a central processing unit (CPU), or other devices in need of heat dissipation. The heat dissipation portion 12 is extended outward from at least one side of the thickness of the heat conduction portion 11 in a horizontal direction V and substantially parallel to the heat conduction portion 11. More precisely, the heat dissipation portion 12 is extended substantially parallel to the surface of the heat source H contacting the heat conduction portion 11. Because the flat portion of the heat conduction portion 11 contacts the heat source H with a large area, the heat can be conducted to the heat dissipation portion 12 by the heat conduction portion 11.

In this embodiment, the heat dissipation portion 12 includes a first branch 121/121a and a second branch 122. The first branch 121/121a is flat and extended from the heat conduction portion 11 in the horizontal direction V as denoted by the arrowhead shown in FIG. 1A. Furthermore, a bending portion 13 is formed between the heat conduction portion 11 and the first branch 121a. Each of the first branches 121/121a are extended in parallel.

At least a second branch 122 is extended from the first branch 121 in a direction vertical to the direction V. The second branches 122 extended from the two adjacent first branches 121/121a, respectively, are connected together so that at least a through hole 124 is formed between the two adjacent first branches 121/121a.

Figure 6A:
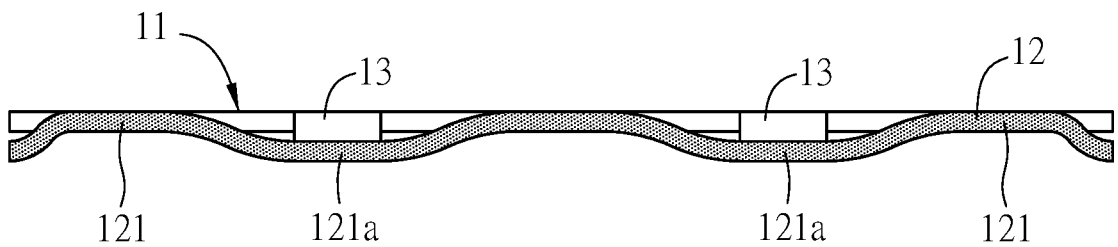
FIGS. 6A to 6C are schematic side-view diagrams of the variations of a heat dissipation portion of a heat sink according to the embodiments shown in FIGS. 1A, 2A and 3, respectively.

FIG. 6A is a schematic side-view diagram of the heat sink 1 from the direction V as shown in FIG. 1A. Please refer to FIGS. 1A and 6A, the heat dissipation portion 12, including the first branch 121/121a and the second branch 122, is a wavy shape in the direction V. However, the heat dissipation portion 12 can also be a jagged shape or a ladder-like shape, but not limited thereto.

When the heat sink is configured with an additional fan (not shown), the airflow generated by the fan can pass through the through holes 124 to bring the heat out so that the heat dissipation effect can be improved.

In order to fix the heat sink 1 of the first embodiment to the top of the heat source H, the screws S are used to fix the flat heat sink 1 to a circuit board or another substrate B, as shown in FIGS. 1A and 1B, so that the heat sink 1 can be prevented from being loosed or moved. However, many other methods can be used to fix the heat sink, and the method of using screws in this embodiment is just for example but not for limiting the scope of the invention.

The height of the heat sink 1 is between 0.5 mm and 6.5 mm so that to be applied to a narrow space.

Figure 2B:
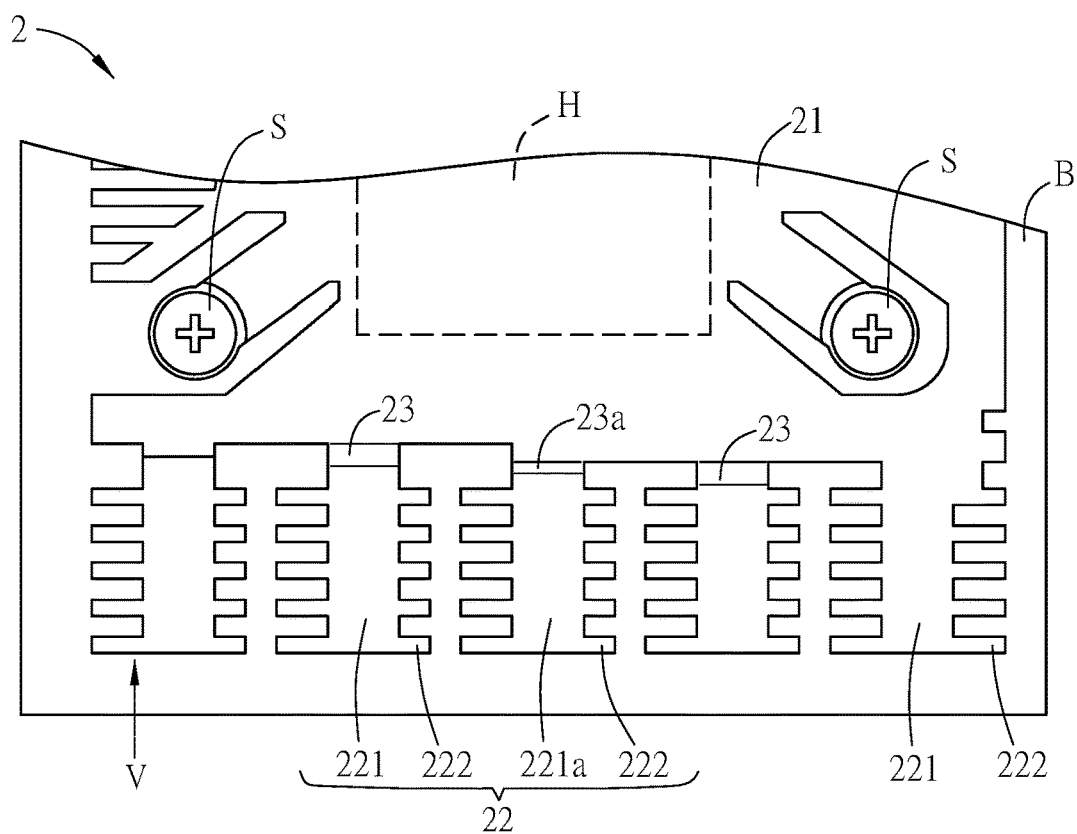

FIG. 2A is a schematic diagram of a heat sink of a second embodiment of the invention, and FIG. 2B is a top-view diagram of the heat sink in FIG. 2A. As shown in FIGS. 2A and 2B, the heat sink 2 includes a heat conduction portion 21 and a heat dissipation portion 22. A flat portion of the heat conduction portion 21 contacts a heat source H. The heat dissipation portion 22 is extended outward from at least one side of the thickness of the heat conduction portion 21 in the horizontal direction V and substantially parallel to the heat conduction portion 21. To be noted, the heat dissipation portion 22 includes at least a first branch 221/221a and a plurality of second branches 222. The second branch 222 is extended outward from one side of the thickness of the first branch 221 or, as shown in FIG. 2A, from two sides of the thickness of the first branch 221. The connection between the heat conduction portion 21 and the first branch 221/221a can have a bending portion 23/23a, respectively. The first branch 221 connected to the heat conduction portion 21 by the bending portion 23 is not coplanar with the first branch 221a connected to the heat conduction portion 21 by the bending portion 23a. However, the first branches 221, 221a are extended parallel to the surface of the heat source H contacting the heat conduction 21. For example, the first branch 221 is lower than the heat conduction portion 21 by the bending portion 23 and the first branch 221a is higher than the heat conduction portion 21 by the bending portion 23a. Accordingly, the adjacent first branches 221/221a are not coplanar, disposed on the different levels, or the heat conduction portion 21 and the heat dissipation portion 22 are disposed on the different levels. Alternatively, the first branch 221 and the heat conduction portion 21 are disposed on the same plane. It means that no bending portion is located therebetween.

Figure 6B:
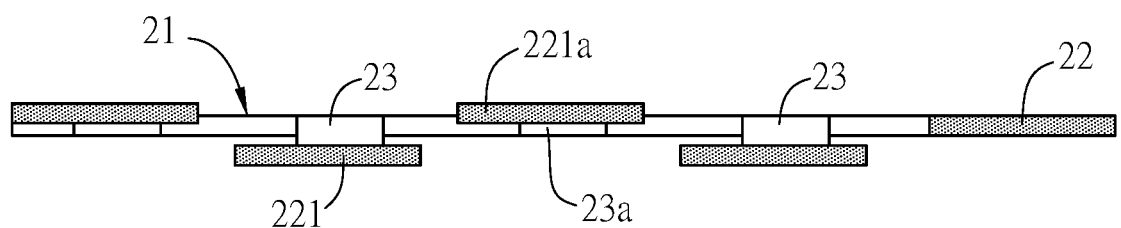

At least a second branch 222 extended from the first branch 221/221a is coplanar with the first branch 221/221a. The second branches 222 extended from the two adjacent first branches 221/221a, respectively, are not coplanar. From another viewpoint, in comparison of the heat sink 1 in FIG. 1A, the second branches 222 shown in FIG. 2A are not connected together so that no through hole is formed between the two adjacent first branches 221/221a. According to the side view of the heat dissipation portion 22 as shown in FIG. 6B taken along the horizontal direction V denoted by the arrowhead in FIG. 2A, the first and second branches 221/221a, 222 from a ladder-like shape. In FIG. 2A, the ladder-like shape is taken as an example, and the adjacent first branches 221/221a are disposed on the different levels due to the bending portions 23/23a. The first branches 221/221a are parallel to each other approximately.

FIG. 3 is a schematic diagram of a heat sink according to a third embodiment of the invention. As shown in FIG. 3, the heat sink 3 includes a heat conduction portion 31 and a heat dissipation portion 32. The heat dissipation portion 32 includes a plurality of first branches 321, second branches 322, and through holes 324. The first branch 321 is extended from the heat conduction portion 31 in the horizontal direction V as denoted by the arrow shown in FIG. 3 and parallel to the surface of the heat source H contacting the heat conduction portion 31. At least a second branch 322 is extended from the first branch 321 in a direction vertical to the direction V and coplanar with the first branch 321. The second branches 322 extended from the two adjacent first branches 321, respectively, are connected together so that at least a through hole 324 is formed between the two adjacent first branches 321.

Figure 6C:
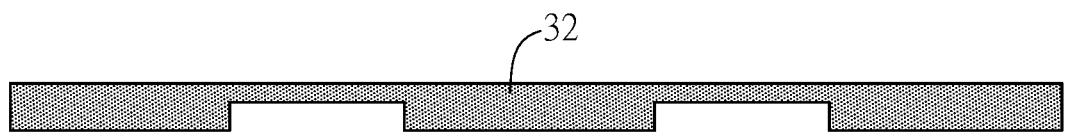

To be noted, the first branch 321 and the second branch 322 can have different thicknesses. The two different second branches 322 can have different thickness. As shown in FIG. 3, the second branch 322a is thicker than the second branch 322b, and the second branches 322a, 322b are arranged alternately. The thinner second branch 322b exists between the two adjacent thicker second branches 322a so that the underside of the heat dissipation portion 32 can provide some channels for the airflow. When the heat sink 3 is configured with an additional fan (not shown), the airflow generated by the fan can pass through the through holes 324 and channels to bring the heat out so as to improve the heat dissipation effect. The side view according to the horizontal direction V denoted by the arrowhead in FIG. 3 is shown in FIG. 6C. Because the heat dissipation principle of the heat sink 3 in FIG. 3 is the same as the heat sinks of the above embodiments, it is not described here for the conciseness.

FIG. 4A is a schematic diagram of a heat sink according to a fourth embodiment of the invention, and the heat sink 4 is formed by the structure of the second embodiment shown in FIGS. 2A and 2B. As shown in FIG. 4A, different from the second embodiment, the first branch 421c is substantially longer than that of the first branch 221 shown in FIG. 2A and more numbers of the second branches 422 can be formed. Moreover, the connection between the first branch and the heat conduction portion 41 is varied. For example, the connection between the first branch 421b and the heat conduction portion 41 has a bending portion 43 along the horizontal direction. When a fan (not shown) is disposed near the heat sink 4 and the wind of the fan blows to the heat sink 4 along the wind direction F, the air will sequentially passes through the underside of the first branch 421a and the top side of the first branch 421b to become the main airflow, and the heat dissipation effect can be thus enhanced. Because the heat dissipation principle of the heat sink 4 in FIG. 4A is the same as the heat sinks of the above embodiments, it is not described here for the conciseness.

Figure 4B:
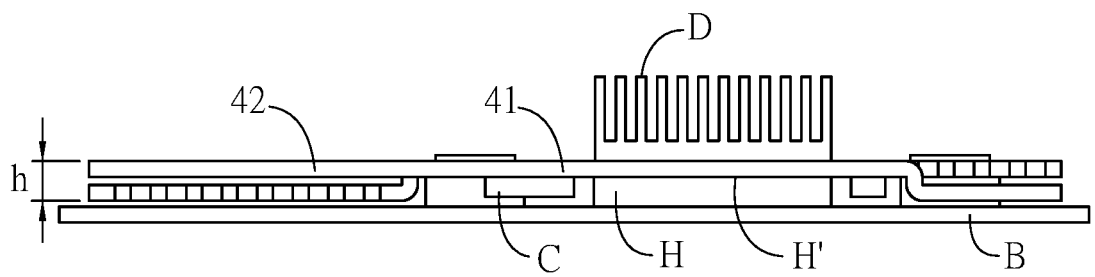
FIG. 4B is a schematic side-view diagram of a heat sink according to an embodiment of the invention.

FIG. 4B is a side-view diagram of the heat sink 4 in FIG. 4A according to a view of the horizontal direction V' denoted by the arrowhead in FIG. 4A. As shown in FIGS. 4A and 4B, a flow guiding structure C can be disposed in the space formed by a side of the heat source H and the level below the surface H' of the heat source H contacting the heat conduction portion 41. When the heat sink 4 is configured with an additional fan (not shown), the fan can be disposed along the direction perpendicular to the normal vector of the flat portion of the heat conduction portion 41 and the wind of the fan blows towards the wind direction F (in FIG. 4A). Accordingly, when the air blows to the flow guiding structure C (also the heat source H), it will be guided to the heat dissipation portion 42 with a smooth air split so that the airflow can be distributed properly for more expanding the heat dissipation effect of the heat dissipation portion 42. To be noted, the heat sinks of the foregoing embodiments also can be varied like the heat sink 4.

Moreover, when the space of the heat sink is allowable, the conventional means for the heat dissipation, such as heat dissipation pillars, heat dissipation fins, heat pipe or their combinations, also can be used, in addition to the dissipation methods of the invention. As shown in FIG. 4B, the flat portion of the heat conduction portion 41 can be extended to provide another heat dissipation structure D opposite to the heat source H. The heat dissipation structure D can be a pillar, fin or their combination. The heat dissipation structure D is connected to the flat portion of the heat conduction portion 41 opposite to the heat source H for enhancing the heat dissipation. Likewise, the heat dissipation element (not shown), such as a heat pipe or a fin, also can be disposed on the side of the heat source H that is not connected to the heat conduction portion 41 for more enhancing the heat dissipation. To be noted, the heat sinks of the foregoing embodiments also can be varied likewise.

To be noted, the heat dissipation portion can include a branch structure. For example, the first branch branches as the second branch, and the cross-sectional area of the second branch is less than or equal to that of the first branch. The first branch can provide the major heat dissipation effect and the second branch can provide some heat dissipation area and channels for the airflow. Therefore, the width or thickness of the second branch is often less than that of the first branch. For the application, the second branch can further branch as a third branch, and the cross-sectional area of the third branch is less than or equal to that of the second branch. However, the invention is not limited thereto.

The heat dissipation portion can be regarded as the extension of the heat conduction portion, and includes a branch structure near the heat conduction portion for avoiding an overlong heat conduction path. The bending portion of the heat dissipation portion also can achieve the same effect. Besides, the through holes of the heat dissipation portion can make the convection so as to provide the air cooling effect.

The heat conduction portion and the heat dissipation portion can be made by the same or different material. For example, the heat conduction portion and the heat dissipation portion are made by the same metal of high conductivity, such as copper or aluminum, or the heat conduction portion is made by copper while the heat dissipation portion is made by aluminum. To be noted, the heat conduction portion and the heat dissipation portion can be integrated into a single structure. When they are integrated into one piece, the structure will be simpler and doesn't need a process of connection. Besides, because the heat conduction portion and the heat dissipation portion are both solid structures, they have better structural strength, in comparison with the conventional thin-type heat pipe or vapor chamber, and the manufacturing process thereof is simpler with a higher yield and lower cost.

The heat conduction portion and the heat dissipation portion can have the same or different thickness and/or level along the direction perpendicular to the heat source H. As shown in FIG. 4B, a part of the heat dissipation portion 42 has a lower level. The thickness h of the heat dissipation portion 42 also can be varied, such as increased. By the variation of the thickness and/or level, the level below the surface H' of the heat source H contacting the heat conduction portion 41 can be configured with a heat dissipation structure so that the narrow or flat space of the electronic apparatus can be utilized more effectively. To be noted, the heat sinks of the foregoing embodiments also can be varied likewise.

There are approximately four sides according to a view of the plane formed by the heat sink as shown in FIG. 4A. At least one of the sides can be configured with a blocking wall (not shown) that is about parallel to the air-outlet direction and disposed adjacent to the heat sink 4, so the airflow generated by the fan can pass through the whole channels to bring the heat out. Likewise, the top side of the surface of the heat conduction portion 41 opposite to the heat source H also can be configured with a blocking wall that is parallel to the plane of the heat sink 4 for achieving the same effect. To be noted, the heat sinks of the foregoing embodiments also can be varied likewise.

Figure 5:
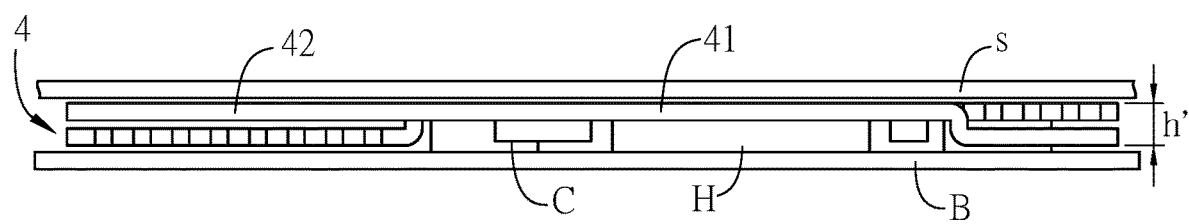
FIG. 5 is a schematic side-view diagram of a heat sink of the invention, showing the relative position of the heat sink and an electronic apparatus.

FIG. 5 is a schematic diagram of a heat sink (the fourth embodiment as an example) of the invention, showing the relative position of the heat sink and an electronic apparatus. As shown in FIG. 5, the heat source H (e.g. a chip) is disposed on the circuit board or another substrate B, such as a printed circuit board (PCB), and a component s (such as a keyboard or panel) disposed inside the housing of the electronic apparatus is over the heat source H. The heat sink 4 is just disposed within the space formed by top side of the substrate B with the heat source H and the underside of the component s, and the space is narrow or flat. To be noted, the height h' of the heat sink is between 0.5 mm and 6.5 mm, so the heat sink is very suitable to this kind of narrow or flat space. The position of the heat sink relative to the electronic apparatus is not limited in the invention.

Moreover, because the heat source H can be a chip, CPU, or other devices in need of heat dissipation, it can be disposed on a circuit board or another substrate B. When the heat conduction portion and the heat dissipation portion of the heat sink is disposed over the heat source H, their thickness or level can be partially changed according to the components on the substrate B. For example, the heat dissipation portion can be reduced in thickness or raised in level so as to become an uneven structure for avoiding the interference with the components on the substrate B.

Besides, any surface of the heat conduction portion and heat dissipation portion can be configured with a plurality of through holes, protrusions, grooves or their combinations for further increasing the heat dissipation area.

In summary, according to the heat sink of the invention applied to a narrow space, a heat conduction material of a certain thickness disposed on the top of the heat source is expanded horizontally to generate a branch structure and vertically changed in shape. Therefore, the heat sink is designed on the basis of the concept of horizontal and vertical structure so as to create three-dimensional airflow channels so that the windward area and the heat exchange area between the heat sink and the air can be both increased and the heat can be dissipated by both of the conduction and convection effects. Besides, the heat sink directly contacts the heat source, so the heat conduction path can be reduced. Furthermore, the heat sink has a solid structure so it can contribute a more reliable strength and can be made by a simpler process.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A heat sink parallel to a circuit board, comprising:
a heat conduction portion, wherein the heat conduction portion is a flat plate with two main surfaces parallel with each other and a plurality of side surfaces, one of the two main surfaces is a contacting surface contacting a heat source on the circuit board, the area of the contacting surface is larger than the area of each of the plurality of side surfaces; and
a heat dissipation portion extended outward from at least one of the plurality of side surfaces of the heat conduction portion, and comprising:
a plurality of first branches extended from the heat conduction portion, wherein each of the plurality of first branches is a flat plate and has a top surface, a bottom surface and four side surfaces, the top surface is opposite to the bottom surface, the bottom surface is closer to the circuit board than the top surface, the area of the top surface or the bottom surface is larger than the area of each of the four side surfaces, the top surface or the bottom surface of each of the plurality of first branches are parallel to the two main surfaces of the heat conduction portion, the top surfaces of at least two of the plurality of first branches are not coplanar; and
a plurality of second branches extended from each of the plurality of first branches and parallel to the heat conduction portion, each of the plurality of second branches is a flat plate and has a top surface, a bottom surface and four side surfaces, the top surface is opposite to the bottom surface, the bottom surface is closer to the circuit board than the top surface, the area of the top surface or the bottom surface is larger than the area of each of the four side surfaces, the top surface of each of the plurality of first branches is coplanar with the top surfaces of the plurality of second branches extending therefrom, wherein the heat sink has a flat form.

2. The heat sink as recited in claim 1, wherein the heat dissipation portion is extended substantially parallel to a surface of the heat source contacting the heat conduction portion.

3. The heat sink as recited in claim 2, further comprising at least a bending portion formed between the heat conduction portion and one of the plurality of first branches.

4. The heat sink as recited in claim 3, wherein the second branches extended from the two adjacent first branches are connected together.

5. The heat sink as recited in claim 4, wherein at least a through hole is formed between the two adjacent first branches.

6. The heat sink as recited in claim 4, wherein the heat dissipation portion is formed a wavy shape from a horizontal direction parallel to the heat conduction portion.

7. The heat sink as recited in claim 3, wherein the heat dissipation portion is formed a ladder shape from a horizontal direction parallel to the heat conduction portion.

8. The heat sink as recited in claim 3, wherein at least two of the plurality of second branches are disposed on different levels.

9. The heat sink as recited in claim 1, wherein one of the plurality of first branches and one of the plurality of second branches are coplanar.

10. The heat sink as recited in claim 1, wherein the first and second branches have different thickness.

11. The heat sink as recited in claim 10, wherein the second branches extended from the two adjacent first branches are connected together.

12. The heat sink as recited in claim 11, wherein at least a through hole is formed between the two adjacent first branches.

13. The heat sink as recited in claim 1, wherein the heat conduction portion and the heat dissipation portion are integrated into a single structure.

14. The heat sink as recited in claim 13, wherein a height of the heat sink is between 0.5 mm and 6.5 mm.

15. The heat sink as recited in claim 1, wherein at least a flow guiding structure is disposed in the space formed by a side of the heat source and a flat portion of the heat conduction portion contacting the heat source.

16. The heat sink as recited in claim 1, wherein the heat source is a chip or a central processing unit.

17. The heat sink as recited in claim 1, wherein the top surface of at least one of the plurality of first branches is coplanar with the other one of the two main surfaces of the heat conduction portion.

* * * * *